(12) United States Patent
Yu et al.

(10) Patent No.: US 7,755,155 B2
(45) Date of Patent: Jul. 13, 2010

(54) PACKAGING STRUCTURE AND METHOD FOR FABRICATING THE SAME

(75) Inventors: Guoping Yu, Jiang Su Province (CN);
Zhiqi Wang, Jiang Su Province (CN);
Guoqing Yu, Jiang Su Province (CN);
Wei Wang, Jiang Su Province (CN);
Quihong Zou, Jiang Su Province (CN)

(73) Assignee: China Wafer Level CSP Ltd., Jiang Su Province (CN)

( * ) Notice: Subject to any disclaimer, the term of this patent is extended or adjusted under 35 U.S.C. 154(b) by 0 days.

(21) Appl. No.: 12/233,807

(22) Filed: Sep. 19, 2008

(65) Prior Publication Data
US 2009/0289317 A1 Nov. 26, 2009

(30) Foreign Application Priority Data
May 26, 2008 (CN) .................. 2008 1 0098168

(51) Int. Cl.
*H01L 31/02* (2006.01)
(52) U.S. Cl. .............. 257/432; 257/433; 257/E21.499; 438/64
(58) Field of Classification Search .......... 257/678, 257/432, 433, 414, E21.499, E31.11; 438/64
See application file for complete search history.

(56) References Cited

U.S. PATENT DOCUMENTS 6,329,608 B1 * 12/2001 Rinne et al. .............. 174/261
7,078,331 B2 * 7/2006 Kwon et al. .............. 438/612
2008/0099900 A1 5/2008 Oganesian et al.

FOREIGN PATENT DOCUMENTS

CN 1519918 A 8/2004

OTHER PUBLICATIONS

Office action issued by Chinese Patent Office on Jun. 26, 2009 for priority application CN 2008100981685.

* cited by examiner

*Primary Examiner*—Roy K Potter
(74) *Attorney, Agent, or Firm*—Frommer Lawrence & Haug LLP; Ronald R. Santucci (57) ABSTRACT

The present invention provides a packaging structure and a method for fabricating the same, the packaging structure includes a chip, a compatible pad provided on the chip, an intermediate metal layer electrically connecting with the compatible pad, a solder bump, and a redistribution metal layer electrically connecting with the solder bump, wherein the redistribution metal layer connects with the intermediate metal layer directly to form an electrical connection. Also, some connections between the redistribution metal layer and the intermediate metal layer are in a manner of concave shape, while other connections between the redistribution metal layer and the intermediate metal layer are in a manner of "-" shape, so that the number of the connections increases while the stability of connection is ensured.

11 Claims, 6 Drawing Sheets

| | |
|---|---|
| Providing a semi-packaging structure 220 consisting of a chip 220, a solder pad 215 extending from the edge of the chip 210, a glass substrate 205, and an insulation layer 230, wherein the solder pad 215 is sandwiched between the glass substrate 205 and the insulation layer 230 so that the chip 220 is enclosed, and a portion of the solder pad 215 is exposed; | S101 |
| Forming an intermediate metal layer 240 on the insulation layer 230 of the semi-packaging structure 200 to create an electrical connection between the intermediate metal layer 240 and the solder pad 215; | S102 |
| Forming a patterned intermediate metal layer 240 on the surface of the insulation layer 230 away from the chip 220; | S103 |
| Forming a mask layer 245 on the intermediate metal layer 240; | S104 |
| Forming a mask via-hole 280 in the mask layer 245 to expose a portion of the intermediate metal layer 240; | S105 |
| Forming a redistribution metal layer 241 on the mask layer 245, so that a direct electrical connection between the redistribution metal layer 241 and the intermediate metal layer 240 is formed in the mask via-hole 280; | S106 |
| Patterning the redistribution metal layer 241 to form a patterned redistribution metal layer on the mask layer 245; | S107 |
| Forming a protective layer 246 on the redistribution metal layer 241; | S108 |
| Forming a protective layer via-hole 281 in the protective layer 246 to expose a portion of the redistribution metal layer 241; | S109 |
| Forming a solder bump electrically connecting with the redistribution metal layer 241 in the protective layer via-hole 281. | S110 |

PACKAGING STRUCTURE AND METHOD FOR FABRICATING THE SAME

This application claims priority benefits from Chinese Patent Application No. 200810098168.5 filed May 26, 2008, the disclosure of which is incorporated herein by reference.

FIELD OF INVENTION

The present invention generally relates to a technology in the field of semiconductor, and more particularly, to a packaging structure and a method for fabricating the same.

BACKGROUND OF THE INVENTION

Wafer level chip size packaging (WLCSP) technique is a process in which a whole wafer is subjected to a packaging, followed by slicing the wafer into individual finished chips, and the packaged chip has a dimension identical to that of the die. WLCSP technique is completely different from conventional packaging techniques such as ceramic leadless chip carrier, organic leadless chip carrier and digital camera module, and satisfies the requirements for the microelectronic products with light weight, small dimension (especially in length and thickness) and low cost. A chip packaged by the WLCSP technique achieves a high level of miniaturization, and its cost decreases prominently with the decrease of chip size and the increase of wafer size. WLCSP technique can integrate IC design, wafer fabrication, packaging test and substrate fabrication, and is a hotspot and development trend in the packaging technological field.

Figure 1:
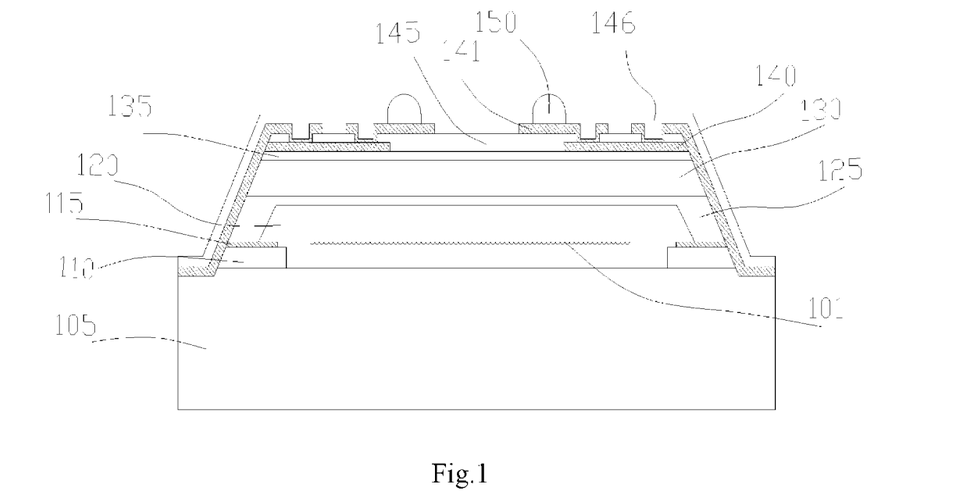
FIG. 1 is a schematic diagram of a packaging structure in the art.

Chinese Patent Application No. 200610096808.X discloses a double-layer lead packaging structure and a method for fabricating the same which is based on WLCSP technique. As shown in FIG. 1, the double-layer lead packaging structure comprises a glass substrate 105 having a cavity wall 110, a chip 120 having a light-sensing element 101 and a compatible pad 115, a glass layer 130, and a solder bump 150. A first surface of the chip 120 on which the light-sensing element 101 is provided connects with the cavity wall 110 through the compatible pad 115. An insulation layer 125 is sandwiched between a second surface of the chip 120 and a first surface of the glass layer 130. A second surface of the glass layer 130 is partially coated with a first solder mask layer 135. The surface of the first solder mask layer 135 is coated partially with a first metal layer 140. The sidewalls of the glass layer 130, the insulation layer 125 and the cavity wall 110 are coated partially with a second metal layer 141, and the second metal layer 141 connects with the compatible pad 115 and the first metal layer 140 to form an electrical connection. The surface of the first metal 140 which does not contact with the first solder mask layer 135 and the surface of the first solder mask layer 135 which does not contact with the glass layer 130 are coated with a second solder mask layer 145, and an opening is provided on the second solder mask layer 145 to expose the first metal layer 140. The inner surface of the opening is coated with the second metal layer 141 which connects with the first metal layer 140 electrically and extends to the second solder mask layer 145 at a position corresponding to the solder bump 150. A protective layer 146 is formed on the surface of the second metal layer 141, and an opening is formed in the protective layer 146 at a position corresponding to the solder bump 150 to expose the second metal layer 141. The solder bump 150 connects with the second metal layer 141 electrically through the opening.

However, other packaging structures suitable for various fabrication processes are still in need.

SUMMARY OF THE INVENTION

The object of the present invention is to provide a packaging structure and a method for fabricating the same.

For achieving the object, the present invention provides a packaging structure, comprising: a chip, a compatible pad provided on the chip; an intermediate metal layer electrically connecting with the compatible pad on the chip; a solder bump; and a redistribution metal layer connecting with the solder bump electrically; wherein the redistribution metal layer directly connects with the intermediate metal layer to form an electrical connection.

In an embodiment of the present invention, the packaging structure has at least two solder bumps, in which for at least one of the solder bumps, the redistribution metal layer connects with the intermediate metal in a manner of concave shape.

In an embodiment of the present invention, for the other solder bumps, the redistribution metal layer connects with the intermediate metal layer in a manner of "-" shape.

In an embodiment of the present invention, the compatible pad connects with the intermediate metal layer in a manner of "T" shape.

In an embodiment of the present invention, the packaging structure further comprises a light-sensing element, a glass substrate, and an insulation layer, wherein a portion of the compatible pad extends from an edge of the chip, the compatible pad is sandwiched between the glass substrate and the insulation layer so that the chip is enclosed, and the light-sensing element is disposed on the side of the chip facing the glass substrate.

The present invention also provides a method for fabricating a packaging structure, comprising the following steps: providing a semi-packaging structure in which a compatible pad is exposed partially; forming an intermediate metal layer on the semi-packaging structure to create an electrical connection between the intermediate metal layer and the compatible pad; etching the intermediate metal layer to form a patterned intermediate metal layer; forming a redistribution metal layer to create a direct electrical connection between the redistribution metal layer and the patterned intermediate metal layer; etching the redistribution metal layer to form a patterned redistribution metal layer; and forming a solder bump on the patterned redistribution metal layer to create an electrical connection between the solder bump and the patterned redistribution metal layer.

In an embodiment of the present invention, the step of forming the redistribution metal layer comprises: forming a mask layer on the side of the semi-packaging structure coated with the intermediate metal layer; forming a mask opening in the mask layer to expose a portion of the intermediate metal layer; forming the redistribution metal layer on the side of the semi-packaging structure coated with the mask layer, so that a direct electrical connection between the redistribution metal layer and the intermediate metal layer is formed in the mask opening.

In an embodiment of the present invention, there are more than one mask opening-holes, and a portion of the redistribution metal layer covers at least one of the mask opening-holes and extends to the surface of the mask layer; furthermore, a protective layer opening does not intersect a corresponding mask opening in the direction perpendicular to the protective layer.

In an embodiment of the present invention, the other portion of the redistribution metal layer covers the other mask opening-holes, and the protective layer opening-holes intersect or coincide with corresponding mask opening-holes in the direction perpendicular to the protective layer.

In an embodiment of the present invention, partially exposing the compatible pad comprises exposing a sidewall of the compatible pad, and the intermediate metal layer electrically connects with the sidewall of the compatible pad.

In an embodiment of the present invention, the semi-packaging structure comprises a light-sensing element, a glass substrate, and an insulation layer, wherein a portion of the compatible pad extends from an edge of the chip, the compatible pad is sandwiched between the glass substrate and the insulation layer so that the chip is enclosed, and the light-sensing element is disposed on the side of the chip facing the glass substrate.

In addition, there are a plurality of connections between the redistribution metal layer and the intermediate metal layer, and at least one of these connections is in a manner of concave shape in order to stabilize the connection.

Further, other connections may be in a manner of "-" shape to reduce the area of the redistribution metal layer, to improve the utilization efficiency of the surface of the packaging structure, and to increase the number of the solder bumps. When some connections are in a manner of concave shape and other connections are in a manner of "-" shape, the number of the bump can be increased with maintaining the connection stability.

BRIEF DESCRIPTION OF THE DRAWINGS

The above and other objects, features and other advantages of the present invention will be more clearly understood from the following detailed description taken in conjunction with the accompanying drawings (the pictures are not drawn pro rate), in which preferable examples are shown. In all drawings, the same signs refer to the same parts. In the drawings, the thicknesses of layers and regions are amplified for purpose of clarity.

DESCRIPTION OF THE PREFERRED EMBODIMENTS

Example 1

The present example provides a packaging structure, comprising: a chip provided with a compatible pad thereon, an intermediate metal layer electrically connecting with the compatible pad, a solder bump, and a redistribution metal layer electrically connecting with the solder bump, wherein a direct electrical connection is formed between the redistribution metal layer and the intermediate metal layer. Optionally, there are at least two solder bumps, and at least one of the solder bumps connects with a redistribution metal layer and an intermediate metal layer between which the connection is in a manner of concave shape. Optionally, the other bumps connect with the redistribution metal layer and the intermediate metal layer between which the connection is in a manner of "-" shape. Optionally, the connection between the compatible pad and the intermediate metal layer is in a manner of "T" shape. Optionally, the packaging structure further comprises a protruded portion of the compatible pad extending from the edge of the chip, a glass substrate, and an insulation layer. The compatible pad is sandwiched between the glass substrate and the insulation layer so as to enclose the chip, and a light-sensing element is disposed on the side of the chip facing the glass substrate.

Hereinafter, this example is specifically described in detail with reference to the accompanying drawings.

Figure 2:
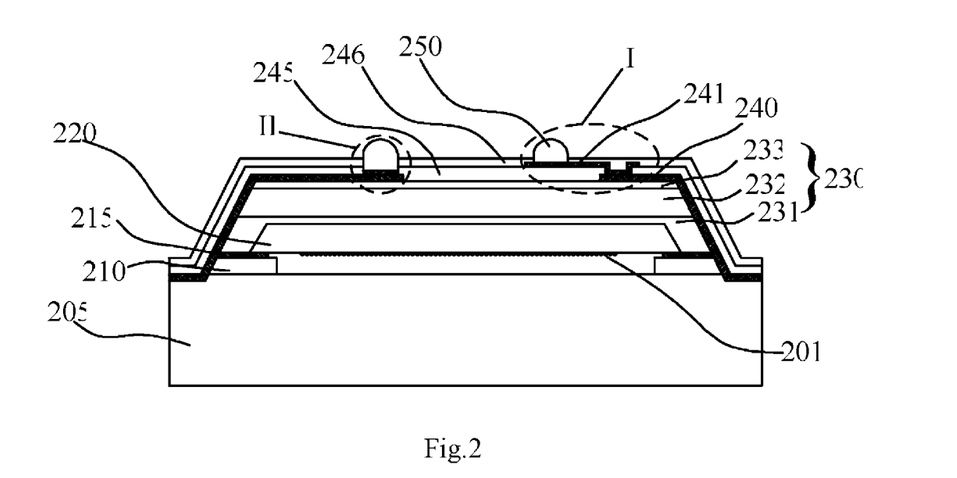
FIG. 2 is a schematic diagram of a packaging structure according to an embodiment of the present invention.
Figure 12:
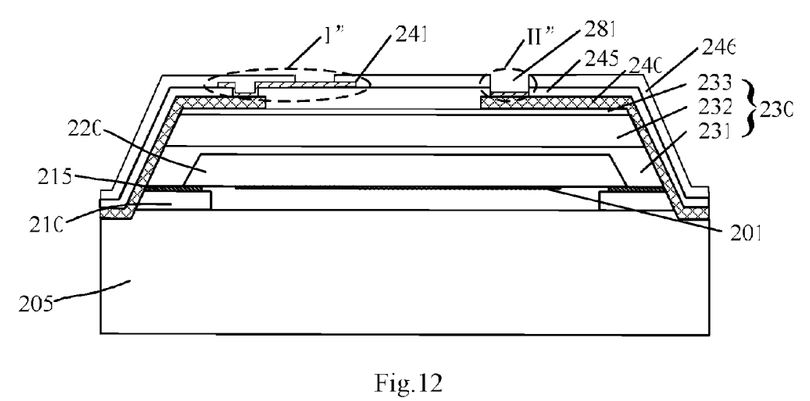

As shown in FIG. 2, the packaging structure of the present example comprises: a glass substrate 205 having a cavity wall 210; a chip 220, a light-sensing element 201 being provided on a surface of the chip, a compatible pad 215 extending from the edge of the chip; an insulation layer 230 formed by stacking an insulation material layer 231, a glass layer 232 and a buffer layer 233 sequentially; an intermediate metal layer 240; a mask layer 245; a redistribution metal layer 241; a protective layer 246, and a solder bump 250. The compatible pad 215 extruding from the edge of the chip 220 is sandwiched between the cavity wall 210 on the glass substrate 205 and the insulation material layer 231 of the insulation layer 230, and the sidewall of the compatible pad is exposed, so that the chip 220 is enclosed by the glass substrate 205 and the insulation layer 230. The surface of the insulation layer 230 away from the glass substrate 205, the sidewalls of the insulation layer 230, and the sidewall of the cavity wall 210 away from the cavity are coated with the intermediate metal layer 240, so that the intermediate metal layer 240 contacts the sidewall of the compatible pad 215 to form an electrical connection. The mask layer 245 is formed on the surface of the intermediate metal layer 240, and a mask opening 280 is formed in the mask layer 245 to expose a portion of the intermediate metal layer 240 (see FIG. 8). The redistribution metal layer 241 is formed on the mask layer 245 and in the mask opening 280, so that the redistribution metal layer 241 directly contacts with the intermediate metal layer 240 in the mask opening 280. The protective layer 246 is formed on the redistribution metal layer 241 to protect the redistribution metal layer 241, and a protective layer opening 281 is formed in the protective layer 246 to expose a portion of the redistribution metal layer 241 (see FIG. 12). The solder bump 250 is provided in the protective layer opening 281 and electrically connects with the redistribution metal layer 241.

The compatible pad 215 extending from the edge of the chip 220 is sandwich between the cavity wall 210 on the glass substrate 205 and the insulation material layer 231 of the insulation layer 230, and the sidewall of the compatible pad 215 is exposed, so that the chip 220 is enclosed by the glass substrate 205 and the insulation layer 230, thereby forming a "glass-silicon-glass" sandwich structure required for fabricating a light-sensing chip package. The sidewall of the insulation layer 230 and the sidewall of the glass substrate 205 form an angle selected from, for example, 50 degree, 55 degree, 60 degree, 65 degree, 70 degree, 75 degree, 80 degree, so as to facilitate the deposition of the intermediate metal layer 240 on the sidewall of the insulation layer 230.

The light-sensing element 201 is deposed on a first surface of the chip 220 facing the glass substrate 205, so that the light-sensing element 201 on the chip 220 is located in a cavity formed by the glass substrate 205, the cavity wall 210 and the chip 220, thereby preventing the light-sensing element 201 from contamination of environment.

The intermediate metal layer 240 contacts the sidewall of the compatible pad 215 to form an electrical connection, that is, the connection between the intermediate metal layer 240 and the compatible pad 215 is in a manner of "T" shape according to a side view of the packaging structure shown in the FIG. 2.

The mask layer 245 covers the surface of the intermediate metal layer 240 to partially separate the intermediate metal layer 240 from the redistribution metal layer 241, so that the redistribution metal layer 241 and the intermediate metal layer 240 are not in the same plane. Thus, the redistribution metal layer 241 can be designed freely without the confinement of the intermediate metal layer 240, and a direct electrical connection between the intermediate metal layer 240 and the redistribution metal layer 241 can be formed in the mask opening 280 of the mask layer 245. Therefore, other metal layer for connecting the redistribution metal layer 241 with the intermediate metal layer 240 in the prior art is not necessary, thereby simplifying the packaging structure, shortening the fabrication process, decreasing the production cost, and increasing the yield. In order to form the mask opening 280 of the mask layer 245, the mask layer 245 can be made of a photolithography material.

The protective layer 246 covers the redistribution metal layer 241, and may cover all parts of the packaging structure except the glass substrate 205 in order to act as a protective layer with insulation and protection functions, that is, the protective layer 246 not only insulates the redistribution metal layer 241 from environment, but also protects the redistribution metal layer 241 and the intermediate metal layer 240 from being damaged.

The protective layer opening 281 is provided in the protective layer 246 to expose a portion of the redistribution metal layer 241. The solder bump 250 is formed in the protective layer opening 281, and contacts the redistribution metal layer 241 to form an electrical connection. Thus, an electrical connection between the solder bump 250 and the internal circuit of the chip 220 is formed through the redistribution metal layer 241, the intermediate metal layer 240 and the solder bump. In order to form the protective layer opening 281 in the protective layer 246, the protective layer 246 can be made of a photolithography material.

When there are a plurality of compatible pads 250 on the chip 220 and a plurality of corresponding solder bumps 250, the intermediate metal layer 240 has an intermediate metal layer pattern, and the redistribution metal layer 241 has a redistribution metal layer pattern, so that the compatible pads 250 electrically connect with the corresponding solder bumps 250 to form an interconnection structure. Consequently, there are many direct connections between the intermediate metal layer 240 and the redistribution metal layer 241, and the connections can be of various shapes.

When the protective layer opening 281 of the protective layer 246 does not intersect the mask opening 280 of the mask layer 245 in the direction perpendicular to the protective layer and a portion of the redistribution metal layer 241 covers the mask opening 280 and extends to the surface of the mask layer 245, a direct connection between the intermediate metal layer 240 and the redistribution metal layer 241 is in a manner of concave shape, as shown in I of FIG. 2. When the protective layer opening 281 of the protective layer 246 intersects or coincides with the mask opening 280 of the mask layer 245 in the direction perpendicular to the protective layer and the redistribution metal layer 241 only covers the mask opening 280, a direct connection between the intermediate metal layer 240 and the redistribution metal layer 241 is in a manner of "-" shape, as shown in II of FIG. 2.

The connection in a manner of concave shape between the intermediate metal layer 240 and the redistribution metal layer 241 has the following advantages: the redistribution metal layer 241 can be provided in a desired pattern so that the solder bumps 250 can be disposed freely at desired positions. The connection in a manner of "-" shape between the intermediate metal layer 240 and the redistribution metal layer 241 has the following advantages: the area of the protective layer 246 occupied by the connection can be reduced so that more solder bumps 250 can be disposed on the surface of the protective layer 246. Of course, as shown in FIG. 2, the connections between the redistribution metal layer 241 and the intermediate metal layer 240 can combine connections of concave shape and connections of "-" shape, so that the number of the connections increases while the stability of connection is ensured.

Furthermore, the connection structure of "-" shape can also be replaced by a structure of other shape to achieve the same effect. For example, in the case that the protective layer opening 281 of the protective layer 246 intersects or coincides with the mask opening 280 of the mask layer 245 in the direction perpendicular to the protective layer, the same effect can also be achieved by forming a single layer electrical connection between the solder bump 250 and the intermediate metal layer 240 in the mask opening 280 without applying the redistribution metal layer 241 in the mask opening 280. Thus, the advantage of freely disposing more solder bumps 250 can also be achieved by combining the connections of concave shape with the connection of "-" shape, or combining the connections of concave shape with the single layer connections, or combining the connections of concave shape, the connection of "-" shape and the single layer connections.

In Example 1, the insulation layer 230 is formed by stacking the insulation material layer 231, the glass layer 232 and the buffer layer 233 in order, wherein the insulation material layer 231 is used to bring about insulation effect, the glass layer 232 is used to improve mechanical strength of the insulation layer, and the buffer layer 233 is used to buffer stress and improve the adhesive force to the intermediate metal layer. Thus, the insulation layer with such a three layer structure is only a specific example, and the present invention is not limited thereby. That is, the insulation effect of the insulation layer may also be achieved by using a single layer material or by using an insulation layer of other multi-layer structure.

Example 2

Example 2 provides a method for fabricating a packaging structure, comprising the following steps: providing a semi-packaging structure in which a compatible pad is exposed partially; forming an intermediate metal layer on the semi-packaging structure to create an electrical connection between the intermediate metal layer and the compatible pad; etching the intermediate metal layer to form a patterned intermediate metal layer; forming a redistribution metal layer to create a direct electrical connection between the redistribution metal layer and the patterned intermediate metal layer; etching the redistribution metal layer to form a patterned redistribution metal layer; forming a solder bump on the patterned redistribution metal layer to create an electrical connection between the solder bump and the patterned redistribution metal layer. Optionally, the step of forming the redistribution metal layer comprises: forming a mask layer on the side of the semi-packaging structure coated with the intermediate metal layer; forming a mask opening in the mask layer to expose a portion of the intermediate metal layer; forming the redistribution metal layer on the side of the semi-packaging structure coated with the mask layer, so that a direct electrical connection between the redistribution metal layer and the intermediate metal layer is formed within the mask opening. Optionally, there are more than one mask opening-holes, and a portion of the redistribution metal layer covers at least one of the mask opening-holes and extends to the surface of the mask layer; furthermore, a protective layer opening does not intersect a corresponding mask opening in the direction perpendicular to the protective layer. Optionally, the other portion of the redistribution metal layer covers the other mask opening-holes, and the protective layer opening-holes intersect or coincide with corresponding mask opening-holes in the direction perpendicular to the protective layer. Optionally, partially exposing the compatible pad comprises exposing a sidewall of the compatible pad, and the intermediate metal layer electrically connects with the sidewall of the compatible pad. Optionally, the semi-packaging structure comprises a light-sensing element, a glass substrate, and an insulation layer, wherein a portion of the compatible pad extends from an edge of the chip, the compatible pad is sandwiched between the glass substrate and the insulation layer so that the chip is enclosed, and the light-sensing element is disposed on the side of the chip facing the glass substrate.

Hereinafter, the detailed description is presented as follows with reference to the accompanying drawings.

Figure 3:
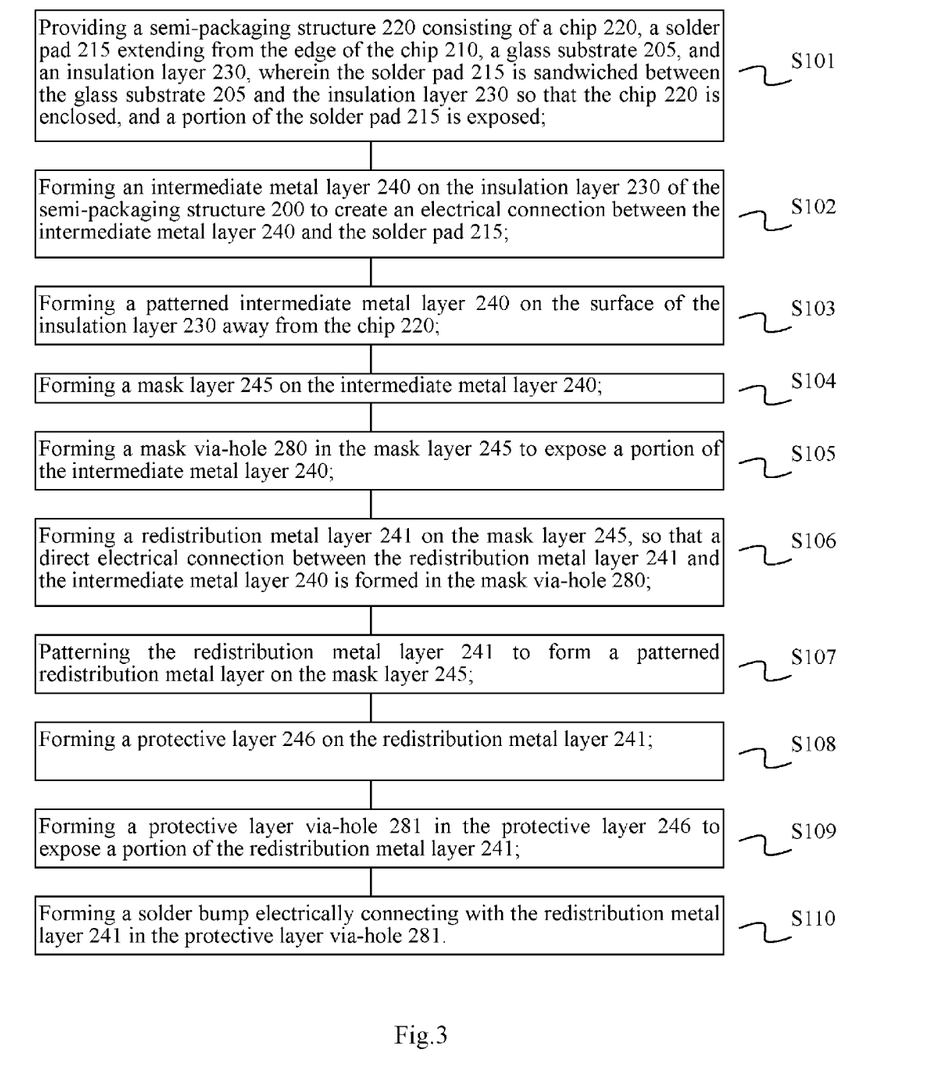
FIG. 3 is a flow diagram illustrating an example of method for fabricating a packaging structure according to an embodiment of the present invention.

As shown in FIG. 3, the method for fabricating a packaging structure comprises the following steps:

S101: providing a semi-packaging structure 220 consisting of a chip 220, a compatible pad 215 extending from the edge of the chip 210, a glass substrate 205, and an insulation layer 230, wherein the compatible pad 215 is sandwiched between the glass substrate 205 and the insulation layer 230 so that the chip 220 is enclosed, and a portion of the compatible pad 215 is exposed;

S102: forming an intermediate metal layer 240 on the insulation layer 230 of the semi-packaging structure 200 to create an electrical connection between the intermediate metal layer 240 and the compatible pad 215;

S103: forming a patterned intermediate metal layer 240 on the surface of the insulation layer 230 away from the chip 220;

S104: forming a mask layer 245 on the intermediate metal layer 240;

S105: forming a mask opening 280 in the mask layer 245 to expose a portion of the intermediate metal layer 240;

S106: forming a redistribution metal layer 241 on the mask layer 245, so that a direct electrical connection between the redistribution metal layer 241 and the intermediate metal layer 240 is formed in the mask opening 280;

S107: patterning the redistribution metal layer 241 to form a patterned redistribution metal layer on the mask layer 245;

S108: forming a protective layer 246 on the redistribution metal layer 241;

S109: forming a protective layer opening 281 in the protective layer 246 to expose a portion of the redistribution metal layer 241; and S110: forming a solder bump electrically connecting with the redistribution metal layer 241 in the protective layer opening 281.

Figure 4:
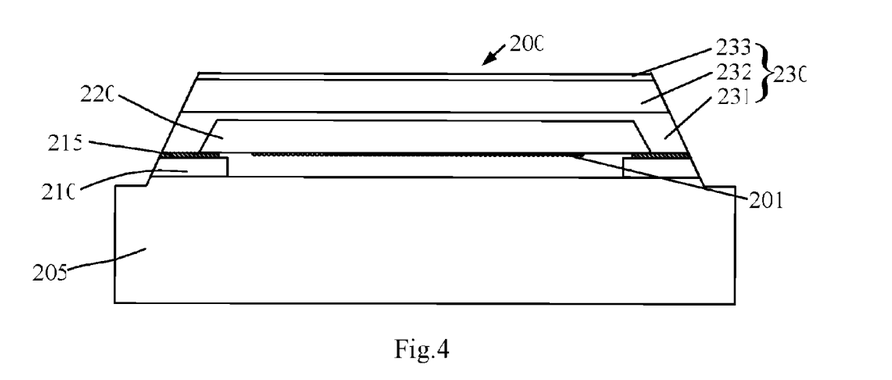
FIG. 4 to FIG. 13 are schematic diagrams of the packaging structure in the steps of FIG. 3, respectively.

The semi-packaging structure 220 provided in the step S101 is shown in FIG. 4, and comprises a chip 220, a compatible pad 215 extruding from the edge of the chip 220, a glass substrate 205 having a cavity wall 210, and an insulation layer 230 formed by stacking an insulation material layer 231, a glass layer 232 and a buffer layer 233 sequentially. The compatible pad 215 is sandwiched between the cavity wall 210 and the insulation material layer 231 so that the chip 220 is enclosed by the glass substrate 205 and the insulation layer 230, and a sidewall of the compatible pad 215 is exposed. The sidewalls of the insulation layer 230 and the glass substrate 205 form an angle in order to facilitate the deposition of intermediate metal layer 240 on the sidewall of the insulation layer 230. The angle can be formed by using a cutter to cut sidewalls of layers other than the glass substrate 205. A light-sensing element 201 can be disposed on the side of the chip 220 facing the glass substrate 205.

Figure 5:
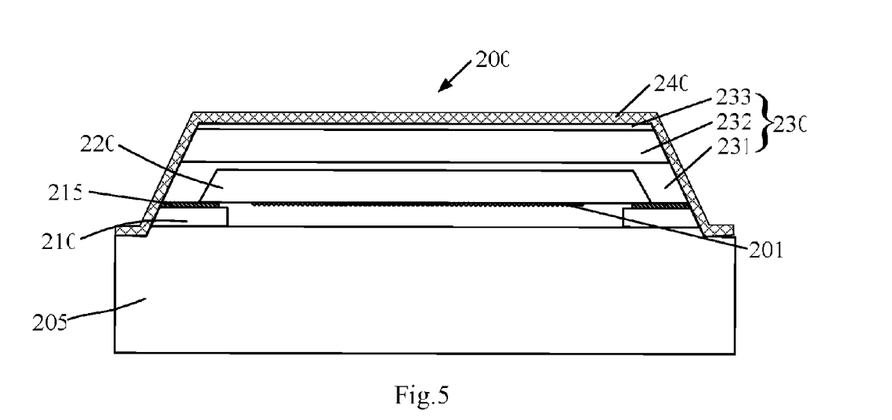

In the step S102, the intermediate metal layer 240 is deposited on the insulation layer 230 by a chemical vapor deposition method or physical vapor deposition method. The semi-packaging structure obtained in the step S102 is shown in FIG. 5.

Figure 6:
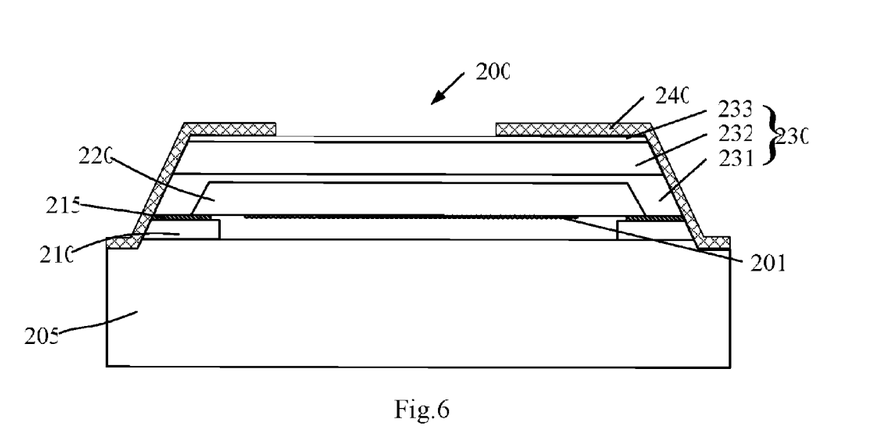

In the step S103, the intermediate metal layer 240 on the surface of the insulation layer 230 away from the chip 220 is patterned to form an intermediate metal layer interconnection pattern by a common photolithography method in the semiconductor field, i.e., transferring an interconnection pattern of mask to the intermediate metal layer 240 by photolithography, so as to obtain a structure as shown in FIG. 6.

Figure 7:
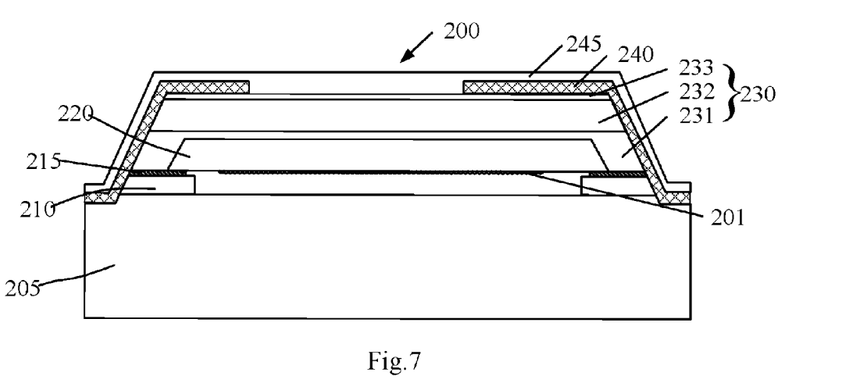

In the step S104, the mask layer 245 can be formed on the intermediate metal layer 240 by a spin-on method, so as to obtain a structure as shown in FIG. 7.

Figure 8:
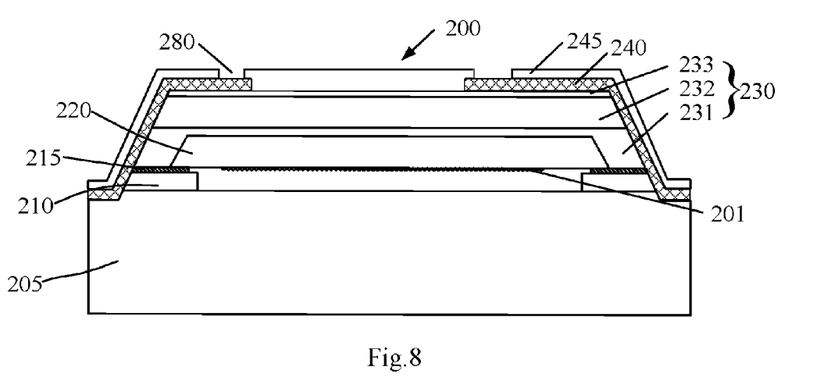

In the step S105, the mask opening 280 is formed by a photolithography method, so as to obtain a structure as shown in FIG. 8.

Figure 9:
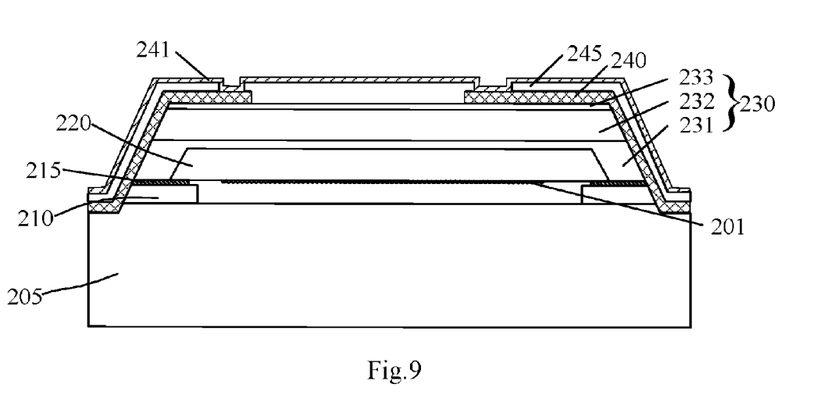

In the step S106, the redistribution metal layer 241 is formed by a photolithography method, so as to obtain a structure as shown in FIG. 9.

Figure 10:
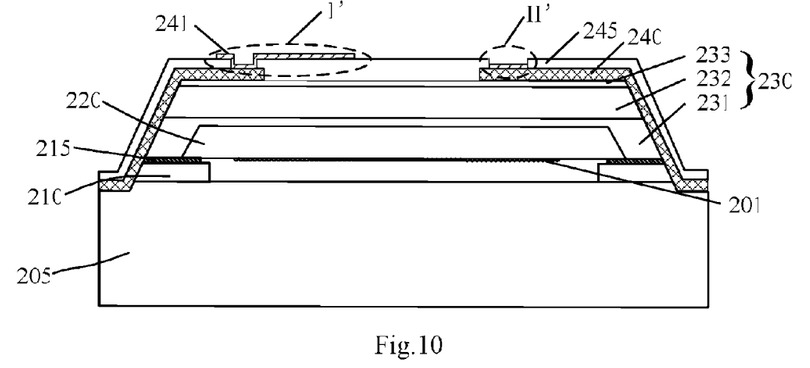

In the step S107, the redistribution metal layer 241 on the mask layer 245 is patterned by photolithography to form a redistribution metal layer interconnection pattern. When the connection between the redistribution metal layer 241 and the intermediate metal layer 240 to be formed in the mask opening 280 is in a manner of concave shape, a portion of the redistribution metal layer 241 within the mask opening 280 and a portion of the redistribution metal layer 241 extending to the surface of the mask layer 245 are remained during the photolithography to obtain a structure as shown in diagram I' of FIG. 10. When the connection between the redistribution metal layer 241 and the intermediate metal layer 240 to be formed in the mask opening 280 is in a manner of "-" shape, only a portion of the redistribution metal layer 241 in the mask opening 280 is remained during the photolithography to obtain a structure as shown in diagram II' of FIG. 10.

Figure 11:
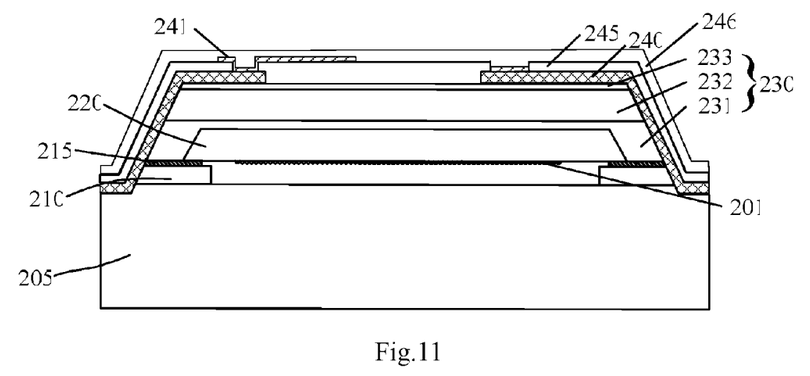

In the step S108, the protective layer 246 is formed by a spin-on method to obtain a structure as shown in FIG. 11.

In the step S109, the protective layer opening 281 can be formed in the protective layer 246 by a photolithography method. When the connection between the redistribution metal layer 241 and the intermediate metal layer 240 to be formed in the mask opening 280 is in a manner of concave shape, the protective layer opening 281 does not intersect the mask opening 280 in the direction perpendicular to the protective layer, so as to form a structure as shown in I" of FIG. 12. When the connection between the redistribution metal layer 241 and the intermediate metal layer 240 to be formed in the mask opening 280 is in a manner of "-" shape, the protective layer opening 280 coincides with the mask opening 281 in the direction perpendicular to the protective layer, so as to form a structure as shown in II" of FIG. 12. It should be understood that the connection between the redistribution metal layer 241 and the intermediate metal layer 240 in a manner of "-" shape can also be formed when the protective layer opening 280 intersects but does not completely coincide with the mask opening 281 in the direction perpendicular to the protective layer.

Figure 13:
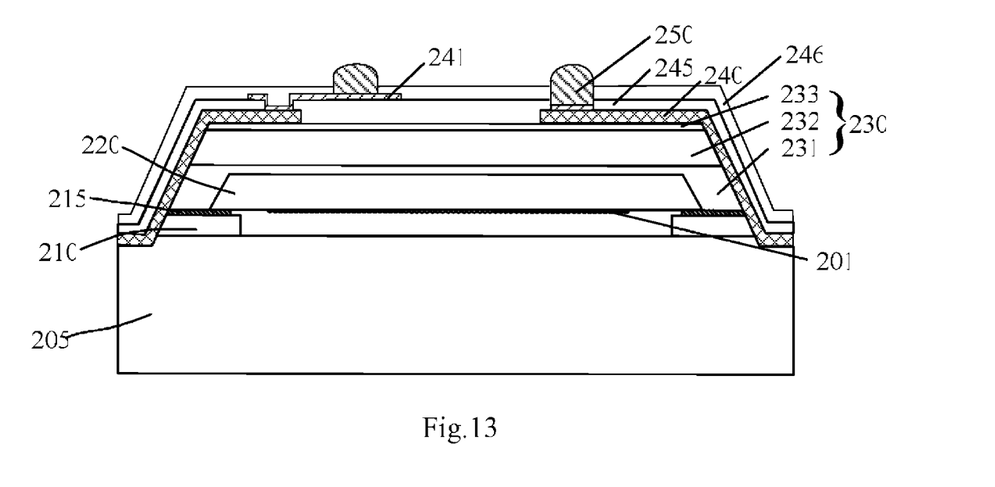

In the step S110, the solder bump 250 is formed in the protective layer opening 281 to connect with the redistribution metal layer 241 electrically, thereby obtaining a structure as shown in FIG. 13.

Although the present invention is further illustrated in the above examples, the present invention is not intended to be limited by these examples. It should be understood that various changes and modifications of these examples may be made without departing from the spirit and scope of the invention as defined in the following claims. The protection scope of the present invention is defined by the appending claims.

What is claimed is:

1. A packaging structure, comprising:
    a chip;
    a compatible pad provided on the chip;
    an intermediate metal layer electrically connecting with the compatible pad;
    a solder bump; and
    a redistribution metal layer electrically connecting with the solder bump, wherein the redistribution metal layer directly connects with the intermediate metal layer to form an electrical connection and wherein the intermediate layer does connect to the solder bump.

2. The packaging structure according to claim 1, wherein the packaging structure comprises at least two solder bumps, and for at least one of the solder bumps, the connection between the redistribution metal layer and the intermediate metal layer is in a manner of concave shape.

3. The packaging structure according to claim 2, wherein for other solder bumps, the connection between the redistribution metal layer and the intermediate metal layer is in a manner of "-" shape.

4. The packaging structure according to claim 1, wherein the connection between the compatible pad and the intermediate metal layer is in a manner of "T" shape.

5. The packaging structure according to claim 1, wherein the packaging structure further comprises a light-sensing element, a glass substrate, and an insulation layer, wherein a portion of the compatible pad extends from an edge of the chip, the compatible pad is sandwiched between the glass substrate and the insulation layer so that the chip is enclosed, and the light-sensing element is disposed on the side of the chip facing the glass substrate.

6. A method for fabricating the packaging structure according to claim 1, the method comprising the following steps:
    providing a semi-packaging structure in which the compatible pad is exposed partially;
    forming the intermediate metal layer on the semi-packaging structure to create an electrical connection between the intermediate metal layer and the compatible pad;
    etching the intermediate metal layer to form a patterned intermediate metal layer; forming the redistribution metal layer to create a direct electrical connection between the redistribution metal layer and the patterned intermediate metal layer;
    etching the redistribution metal layer to form a patterned redistribution metal layer; and
    forming the solder bump on the patterned redistribution metal layer to create an electrical connection between the solder bump and the patterned redistribution metal layer wherein the intermediate layer does connect to the solder bump.

7. The method for fabricating a packaging structure according to claim 6, wherein the step of forming the redistribution metal layer comprises:
    forming a mask layer on the side of the semi-packaging structure coated with the intermediate metal layer;
    forming a mask opening in the mask layer to expose a portion of the intermediate metal layer; and
    forming the redistribution metal layer on the side of the semi-packaging structure coated with the mask layer, so that the redistribution metal layer connects with the intermediate metal layer to form an electrical connection within the mask opening.

8. The method for fabricating a packaging structure according to claim 7, wherein there are a plurality of mask opening-holes in the packaging structure, a portion of the redistribution metal layer covers at least one mask opening and extends to the surface of the mask layer, and the protective layer opening does not intersect the corresponding mask opening in the direction perpendicular to the protective layer.

9. The method for fabricating a packaging structure according to claim 8, wherein the other portion of the redistribution metal layer covers only other mask opening-holes, and the protective layer opening intersects or coincides with the corresponding mask opening in the direction perpendicular to the protective layer.

10. The method for fabricating a packaging structure according to claim 7, wherein to expose a portion of the compatible pad is to expose a sidewall of the compatible pad, and the intermediate metal layer connects with the sidewall of the compatible pad to form an electrical connection.

11. The method for fabricating a packaging structure according to claim 7, wherein the semi-packaging structure further comprises a light-sensing element, a glass substrate, and an insulation layer, wherein a portion of the compatible pad extends from an edge of the chip, the compatible pad is sandwiched between the glass substrate and the insulation layer so that the chip is enclosed, and the light-sensing element is disposed on the side of the chip facing the glass substrate.

* * * * *

UNITED STATES PATENT AND TRADEMARK OFFICE
CERTIFICATE OF CORRECTION

| | | |
|---|---|---|
| PATENT NO. | : 7,755,155 B2 | Page 1 of 1 |
| APPLICATION NO. | : 12/233807 | |
| DATED | : July 13, 2010 | |
| INVENTOR(S) | : Guoping Yu et al. | |

It is certified that error appears in the above-identified patent and that said Letters Patent is hereby corrected as shown below:

ON THE TITLE PAGE:

In Item (75)

Please change the fifth inventor's name from:

Quihong Zou
to
Qiuhong Zou

Signed and Sealed this

Twenty-sixth Day of October, 2010

David J. Kappos
*Director of the United States Patent and Trademark Office*